(12) United States Patent
Taya et al.

(10) Patent No.: US 11,398,411 B2
(45) Date of Patent: Jul. 26, 2022

(54) METHOD FOR MANUFACTURING SEMICONDUCTOR ELEMENT

(71) Applicant: NEXCHIP SEMICONDUCTOR CO., LTD., Anhui (CN)

(72) Inventors: Masatoshi Taya, Hyogo (JP); Norio Nakano, Kanagawa (JP); Yasuhiro Kumagai, Tokyo (JP)

(73) Assignee: NEXCHIP SEMICONDUCTOR CO., LTD., Anhui (CN)

( * ) Notice: Subject to any disclaimer, the term of this patent is extended or adjusted under 35 U.S.C. 154(b) by 0 days.

(21) Appl. No.: 16/907,085

(22) Filed: Jun. 19, 2020

(65) Prior Publication Data

US 2021/0398860 A1    Dec. 23, 2021

(51) Int. Cl.
  *H01L 21/266* (2006.01)
  *H01L 21/8238* (2006.01)
  *H01L 29/66* (2006.01)

(52) U.S. Cl.
  CPC .... *H01L 21/823814* (2013.01); *H01L 21/266* (2013.01); *H01L 21/823807* (2013.01); *H01L 29/66189* (2013.01)

(58) Field of Classification Search
  CPC ........... H01L 21/823814; H01L 21/266; H01L 21/823807
  See application file for complete search history.

(56) References Cited

U.S. PATENT DOCUMENTS

| 5,045,904 A | * | 9/1991 | Kobayashi | ........ H01L 27/10829 257/304 |
| 2009/0166747 A1 | * | 7/2009 | Niimi | .............. H01L 21/823857 257/369 |
| 2010/0025771 A1 | * | 2/2010 | Hoentschel | ......... H01L 29/7843 257/369 |
| 2015/0084108 A1 | * | 3/2015 | Saha | ................. H01L 21/26513 257/314 |

\* cited by examiner

*Primary Examiner* — Errol V Fernandes
(74) *Attorney, Agent, or Firm* — Global IP Services; Tianhua Gu

(57) ABSTRACT

The present disclosure provides a method for manufacturing semiconductor element. The method includes: a first masking process, forming a resist layer on the surface of the substrate; a channel forming process, implanting impurities with the same polarity as a well of an FET region into the surface of the substrate, and forming a channel region for the well of the FET region; a gate forming process, forming gates G respectively on the well of the FET region and the well of the variable-capacitance diode region separated by insulating films; a second masking process, generating a second implantation barrier layer on the surface of the substrate; and an epitaxy forming process, implanting impurities with the opposite polarity to that of the well of the FET region into the surface of the substrate, and forming an epitaxy region for the well of the FET region.

8 Claims, 7 Drawing Sheets

METHOD FOR MANUFACTURING SEMICONDUCTOR ELEMENT

TECHNICAL FIELD

The present disclosure relates to a method for method for manufacturing a semiconductor element.

BACKGROUND

In order to control transmission frequency, a variable-capacitance element is adopted in an integrated circuit. As the variable-capacitance element, an MOS type variable-capacitance element (MOS variable-capacitance diode) is used.

In the integrated circuit, multiple kinds of semiconductor elements manufactured, so that the variable-capacitance element may be manufactured together with, for example, an FET. If the variable-capacitance element is manufactured with the FET, impurities may be implanted into the variable-capacitance element in a manufacturing process of a semiconductor, and the capacitance characteristics of the variable-capacitance device will be deteriorated.

In the manufacturing process of the semiconductor, masks used in a photolithography are very expensive, and it is desirable to inhibit the total number of used masks. However, if sharing the masks in different processes, impurities may be implanted into the variable-capacitance element.

SUMMARY

The present disclosure provides a method for manufacturing a semiconductor element and a semiconductor structure, which saves cost and prevents deterioration of capacitance characteristics of a variable-capacitance element.

In the method for manufacturing the semiconductor element according to an embodiment of the present disclosure, an FET of an MOS structure and a variable-capacitance element are formed on a surface of a substrate. The method includes: a first masking process, forming a first implantation barrier layer on the surface of the substrate, wherein the first implantation barrier layer covers a surface of a well of a variable-capacitance element region; a channel forming process, implanting impurities into the surface of the substrate, and forming a channel region for the well of the FET region, the impurity has a polarity the same as the polarity of a well in an FET region formed on the surface of the substrate; a gate forming process, forming gates respectively on the well of the FET region and the well of the variable-capacitance element region, wherein the gate is insulated from the well of the FET region and the well of the variable-capacitance element region by an insulating film; a second masking process, generating a second implantation barrier layer on the surface of the substrate, wherein the second implantation barrier layer covers a region identical to the first implantation barrier layer; and an epitaxy forming process, implanting impurities with the polarity opposite to the polarity of the well in the FET region into the surface of the substrate, and forming an epitaxy region for the well of the FET region.

Before the channel forming process for implanting impurities with the same polarity as the well of the FET region into the surface of the substrate, the first implantation barrier layer in the covering the surface of the well of the variable-capacitance element region is formed, so that the impurities can be prevented from being implanted into the well of the variable-capacitance element region. Therefore, the deterioration of the capacitance characteristics of the variable-capacitance element can be inhibited.

In the second masking process, the second implantation barrier layer is formed on the surface of the substrate. The second implantation barrier layer covers the region identical to the first implantation barrier layer in the first masking process. The tools for forming implantation barrier layers, such as photomasks, can be shared, the total number of masks used in the manufacturing process of an integrated circuit can be reduced, and the cost is saved.

The method for manufacturing the semiconductor element further includes a well forming process, forming the well of the FET region, and the well of the variable-capacitance element region with the polarity opposite to the well of the FET region on the surface of the substrate. The first masking process is performed after the well forming process.

Even the well in the FET region and the well in the variable-capacitance element region are formed on the surface of the substrate, the channel forming process can be performed by using the first implantation barrier layer, which covers the surface of the well of the variable-capacitance element. The deterioration of the capacitance characteristics of the variable-capacitance element can be inhibited.

Optionally, in the first masking process, the first implantation barrier layer is formed by using photomask, and in the second masking process, the second implantation barrier layer is formed by using the photo mask.

By sharing the photo mask for forming the first implantation barrier layer and the second implantation barrier layer, a number of the photomask can be reduced, and a cost of the integrated circuit is reduced. In the second masking process, the photomask in the first masking process performed on the same substrate may be used. When concurrent manufacturing, the photomask in the first masking process performed on other substrates may also be used (borrowed).

In some embodiments, the first implantation barrier layer and the second implantation barrier layer are resist layers.

In some embodiments, when the channel forming process is completed, the first implantation barrier layer formed on a substrate surface is removed.

In some embodiments, when the epitaxy forming process is completed, the second implantation barrier layer formed on the substrate surface is removed.

In some embodiments, after the epitaxy forming process, sidewalls are formed for the gates.

In some embodiments, when the sidewalls are formed, a silicon oxide film is formed on the substrate surface, anisotropy is performed, and oxide films are remained on the sidewalls of the gates.

In some embodiments, the method for manufacturing the semiconductor element further includes: before the gate forming process, respectively forming a source and a drain in the FET region and a variable-capacitance diode region.

The present disclosure further provides a semiconductor structure, including: a substrate, including an FET region and a variable-capacitance element region; and an implantation barrier layer, covering a surface of a well of the variable-capacitance element region and exposing the surface of the well in the FET region.

According to the present disclosure, the deterioration of the capacitance characteristics of the variable-capacitance element can be inhibited, and the cost can be saved.

DESCRIPTION OF REFERENCE SYMBOLS IN THE DRAWINGS

D: drain
Ex: epitaxy
G: gate
Ox: gate oxide film
P1: well forming process
P3: channel forming process.
P4: gate forming process
P6: epitaxy forming process
P7: drain forming process
Res: resist layer
S: source

DETAILED DESCRIPTION OF THE PREFERRED EMBODIMENTS

Hereinafter, an embodiment of a method for manufacturing a semiconductor element according to the present disclosure is illustrated with reference to the accompanying drawings.

FIGS. 1 to 5 are schematic diagrams of the method for manufacturing the semiconductor element according to an embodiment of the present disclosure. In FIGS. 1 to 5, longitudinal sectional views of the semiconductor element of an N type metal-oxide-semiconductor (MOS) structure are shown. Additionally, in FIGS. 1 to 5, field effect transistor (FET) of NMOS structure is formed on the left side (called as FET region hereinafter), and a variable-capacitance diode of NMOS structure is formed on the right side (called as variable-capacitance diode region hereinafter). That is, MOSFET and MOS variable-capacitance diodes are manufactured on the surface of the same substrate (silicon substrate).

Although FIGS. 1 to 5 show manufacturing of NMOS structure semiconductor, the present application can also be applied to manufacture a semiconductor of PMOS structure.

Figure 1:
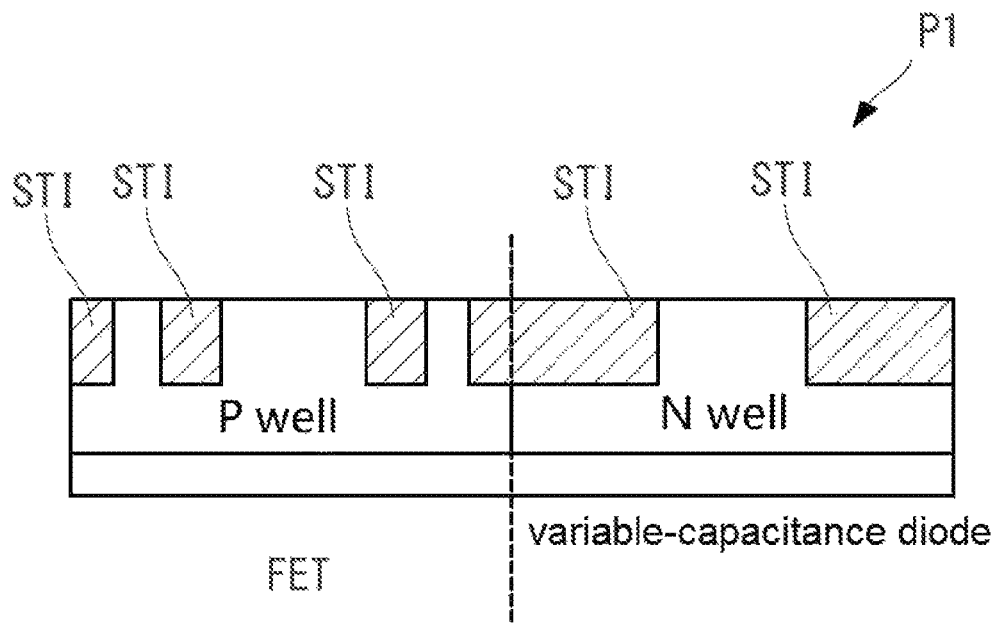
FIG. 1 shows a schematic diagram of a well forming process of a method for manufacturing a semiconductor element according to an embodiment of the present disclosure.
Figure 2:
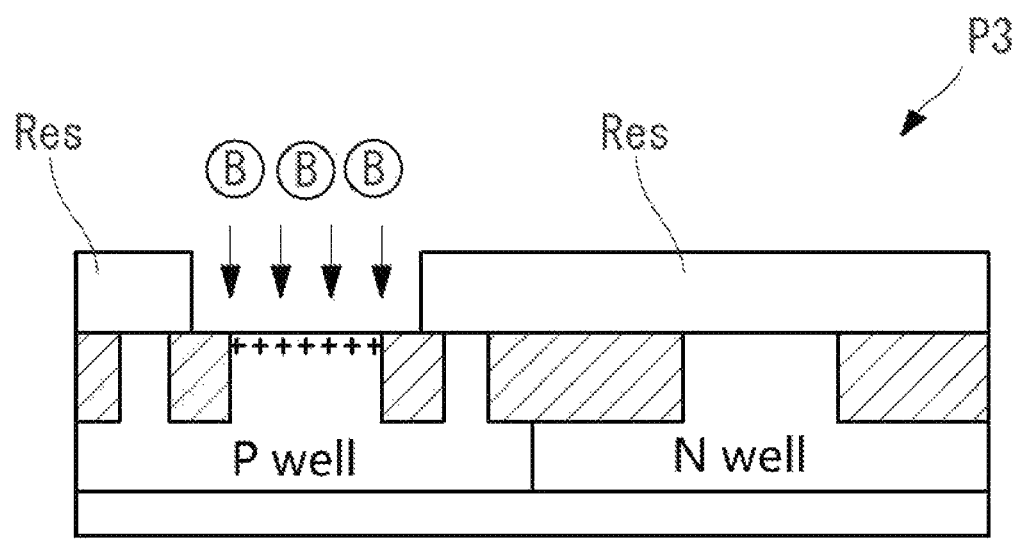
FIG. 2 shows a schematic diagram of a channel forming process of the method for manufacturing the semiconductor element according to an embodiment of the present disclosure.
Figure 3:
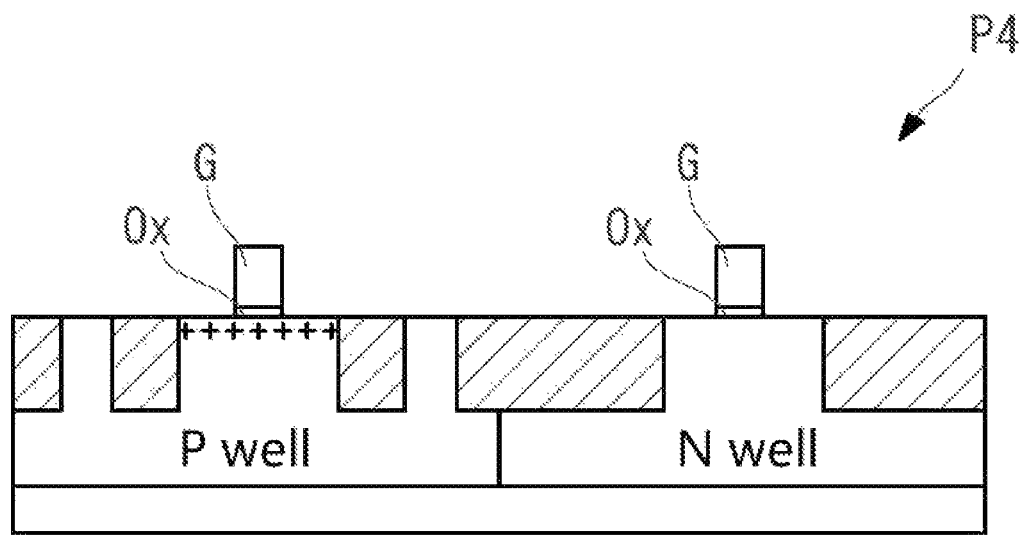
FIG. 3 shows a schematic diagram of a gate forming process of the method for manufacturing the semiconductor element according to an embodiment of the present disclosure.
Figure 4:
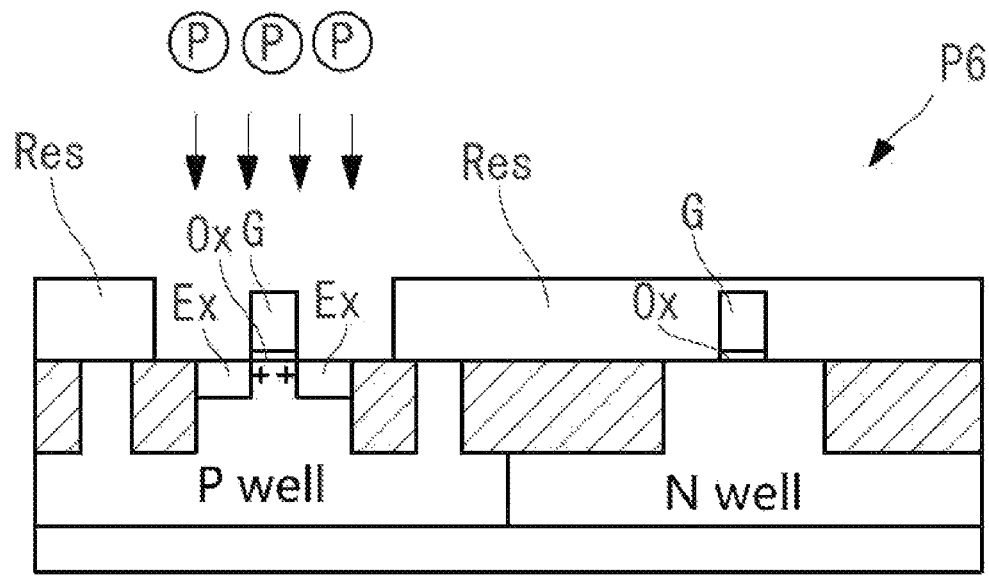
FIG. 4 shows a schematic diagram of an epitaxy forming process of the method for manufacturing the semiconductor element according to an embodiment of the present disclosure.
Figure 5:
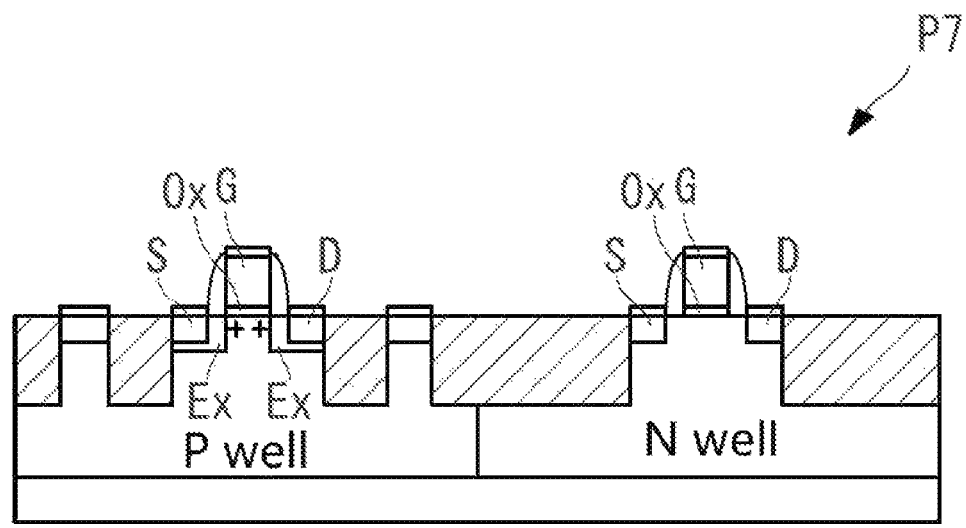
FIG. 5 shows a schematic diagram of a source/drain forming process of the method for manufacturing the semiconductor element according to an embodiment of the present disclosure.

The method for manufacturing the semiconductor according to the present embodiment mainly includes a well forming process P1 shown in FIG. 1, a first masking process, a channel forming process P3 shown in FIG. 2, a gate forming process P4 shown in FIG. 3, a second masking process, an epitaxy forming process P6 shown in FIG. 4, and a source/drain forming process P7 shown in FIG. 5. The method for manufacturing the semiconductor according to the present embodiment is not limited to the above-described processes if it the channel forming process P3 and the epitaxy forming process P6 are included.

Preprocessing, i.e. preparing the substrate (wafer), is performed before performing each process. The substrate is manufactured by processing, for example, monocrystalline silicon into a shape compatible with the chip manufacturing process. The FET and the variable-capacitance diode are manufactured on a substrate surface. The substrate surface refers to a region adjacent to the surface of the substrate (near the surface) in an internal direction and an external direction relative to. Specifically, a well, and a source S/drain D of the FET are formed in the adjacent region in the internal direction relative to the surface of the substrate, and gates G of the FET are formed in the adjacent region in the external direction relative to the surface of the substrate.

In the well forming process P1, wells of the semiconductor element are formed on the surface of the substrate. As shown in FIG. 1, the well of the FET and the well of the variable-capacitance diode which has a polarity opposite to the polarity of the well of the FET are formed. In FIG. 1, shallow trench isolation (STI) is an element isolation region for preventing interference of the adjacent semiconductor elements.

The FET is an NMOS transistor, so that a P type well (called as "P-well" hereinafter) is formed in the FET region. In order to form the P-well, P type impurities (such as boron) are implanted into the FET region. When forming the P-well in the FET region, the substrate surface of the variable-capacitance diode region is masked to prevent the P type impurities from being implanted in the variable-capacitance diode region.

In the variable-capacitance diode, an N type well (called as "N-well" hereinafter) is formed in the variable-capacitance diode region, so that a high capacitance value can be ensured in a low-voltage region. In order to form the N-well, N type impurities (such as phosphorus) are implanted into the variable-capacitance diode region. When forming the N-well in the variable-capacitance diode region, the substrate surface of the FET region is masked to prevent the N type impurities from being implanted in the FET region.

Therefore, in the well forming process P1, the P-well is formed in the FET region, and the N-well is formed in the variable-capacitance diode region.

In the first masking process, a first implantation barrier layer (resist layer) is formed on the surface of the substrate. The resist layer has a shape of covering the surface of the well in the variable-capacitance diode region. In an integrated circuit, photomasking process is performed on the substrate surface by a photoetching technology. For example, a resist layer Res (photosensitizer) is coated on the whole substrate surface. Then, photomasks (called as "mask" hereinafter) are used to transfer patterns preformed on the masks onto the resist layer Res. The masks are base plates obtained by drawing specified patterns on a surface of, for example, a glass plate by chromium, light can transmit from the parts not covered by the chromium. Therefore, as exposure processing, light (ultraviolet rays) is irradiated on the resist layer Res through the masks, the patterns (the parts not covered by the chromium) formed on the masks are transferred onto the resist layer Res. The physical properties of the parts irradiated by the light in the resist layer Res change, therefore can be dissolved by developing liquid, so that the parts irradiated by the light can be removed. The patterns drawn on the masks are transferred to the resist layer of the substrate surface. The patterns drawn on the masks require an extremely high precision along with fining of the semiconductor element, and the masks themselves are very expensive. Therefore, the total number of the masks is required to be inhibited in the manufacturing processes of the semiconductor.

In the first masking process, a first mask (photomask) formed with a preset pattern is used. In the well forming process P1, the resist layer Res with the specified pattern is formed on the substrate surface with the wells. In the present embodiment, patterns on the first mask are drawn by the resist layer Res covering the substrate surface to form the well of the variable-capacitance diode. Therefore, when the first mask is used to generate the resist layer Res, the N-well of the variable-capacitance diode formed by the well forming process P1 is covered by the resist layer Res. The P-well of the FET formed by the well forming process P1 is not covered by the resist layer Res. That is, the surface of the well of the FET region is exposed, so that impurities can be implanted into the FET region in the channel forming process P3.

In the channel forming process P3, channels are formed in the FET region. Specifically, in the channel forming process P3, impurities are implanted into the surface of the substrate to form a channel region for the well of the FET. The impurity has a polarity the same polarity as the well of the FET region formed on the surface of the substrate. In FIG. 2, the P-well is formed in the FET region. Therefore, in the channel forming process P3, P type impurities (such as boron) are implanted into the surface of the substrate. Through the first masking process, the surface of the variable-capacitance diode region is covered by the resist layer Res, so that the P type impurities are not implanted into the variable-capacitance diode region.

When the channel forming process P3 is completed, the resist layer Res formed on the substrate surface is removed.

In the gate forming process P4, gates are respectively formed on the well of the FET and the well of the variable-capacitance diode, and the gates are separated by insulating films. As shown in FIG. 3, the gate forming process P4 is a process for forming the gates G on the semiconductor element. Firstly, the whole substrate surface including the FET region and the variable-capacitance diode region is oxidized to from a gate oxide film Ox. Then, polysilicon (polycrystalline silicon) is formed on the whole surface of the gate oxide film Ox by, for example, chemical vapor deposition (CVD) method. Then, in the FET region and the variable-capacitance diode region, the resist layer Res is formed in gate forming positions (the surface of the polysilicon). In this state, the polysilicon and the gate oxide film Ox not covered by the resist layer Res are etched. Then, the gates G are respectively formed in the FET region and the variable-capacitance diode region by removing the resist layer Res.

In the second masking process, a second implantation barrier layer (resist layer) is formed on the surface of the substrate. The resist layer covers the region identical to the first implantation barrier layer. That is, in the second masking process, the photoetching technology is used, a second mask (photomask) formed with a specified pattern is used, the substrate surface of the gates G is formed in the gate forming process P4, and the resist layer Res with a specified pattern is formed. The second mask has the pattern in the same shape as the first mask, and the patterns are drawn in a mode of covering the resist layer Res on the well of the variable-capacitance diode formed on the substrate surface. Therefore, when the second mask is used to form the resist layer Res, the N-well of the variable-capacitance diode is covered by the resist layer Res. The P-well of the FET is not covered by the resist layer Res. Therefore, impurities can be implanted into the FET region in the epitaxy forming process P6.

In the second masking process, the patterns are in the same shape as that of the first mask in the first masking process, the first mask and the second mask are preferably universal (shared). For example, if one manufacturing device of the semiconductor element operates, the first mask used in the manufacturing device can be borrowed as the second mask. If a plurality of manufacturing devices of the semiconductor element concurrently operates, the first masks used in other manufacturing devices in concurrent operation can also be borrowed as the second masks. That is, the first mask in the first masking process and the second mask in the second masking process can be shared, so that the total number of the masks involved in the manufacturing of the semiconductor can be reduced. Therefore, the requiring quantity of the expensive masks can be reduced, and the cost can be effectively reduced.

In the epitaxy forming process P6, an epitaxy Ex is formed in the FET region. The epitaxy Ex is a component configured to prevent electrons moving between the source S and the drain D from becoming hot carriers and damaging the gate oxide film Ox due to a strong electric field generated beside a terminal of the source S/drain D. The epitaxy Ex is also called as a lightly doped drain (LDD) or a low-concentration impurity drain.

In the epitaxy forming process P6, impurities with the polarity opposite to the well of the FET are implanted into the surface of the substrate, and the epitaxy Ex is formed for the well of the FET region. As shown in FIG. 4, the P-well is formed in the FET region. Therefore, in the epitaxy forming process P6, the N type impurities (such as phosphorus) are implanted into the surface of the substrate. At the moment, through the second masking process, the surface of the variable-capacitance diode region is covered by the resist layer Res, so that the N type impurities are not implanted into the variable-capacitance diode region.

When the epitaxy forming process P6 is completed, the resist layer Res formed on the substrate surface is removed. After the epitaxy forming process P6, sidewalls may be formed for the gates G. When forming the sidewalls for realize silication of the gates G, the source S and the drain D, the self-resistance of electrodes of the gates G, the source S and the drain D can be reduced, or the resistance with a later metal wiring can be reduced. The sidewalls are formed, for example, through the following steps: a silicon oxide film is formed on the whole substrate surface, and anisotropic etching (back etching), to thus remain oxide films on the sidewalls of the gates G.

In the source/drain forming process P7, a source S and a drain D are respectively formed in the FET region and the variable-capacitance diode region. Structures of the FET and the variable-capacitance diode are bilaterally symmetrical with respect to the gates G. Therefore, which of the source S and the drain D is formed in the source/drain forming process P7 is determined by a direction of the applied voltage.

As shown in FIG. 5, the P-well is formed in the FET region, the N type impurities (such as phosphorus) are implanted into the P-well. Therefore, the N type impurities are implanted into a region not covered by the gate G in the surface of the P-well in the FET region. Through the implantation of the N type impurities, PN junctions are formed between the source S and the P-well and between the drain D and the P-well. When no voltage is applied to the gates G, no current flows between the drain D and the source S. However, when a positive voltage is applied to the gates G, electrons are gathered on the surface of the P-well under the gate G to locally form an inversion layer (N type region). Therefore, the electrons flows between the drain D and the source S through the inversion layer on the surface of the P-well.

The variable-capacitance diode region is also implanted with N type impurities (such as phosphorus). That is, the N type impurities are implanted into a region not covered by the gate G in the surface of the N-well in the variable-capacitance diode region. Therefore, the variable-capacitance diode region includes an N type well, an N type source S, an N type drain D, and a gate G separated by a gate oxide film Ox (insulating film). A high capacitance value can be ensured between the source S as well as the drain D and the gate G, even in a low-voltage region (near 0 V).

After the source/drain forming process P7 is completed, for example, silicide is formed, and a wiring is formed, so that an integrated circuit (IC) is formed.

Figure 6:
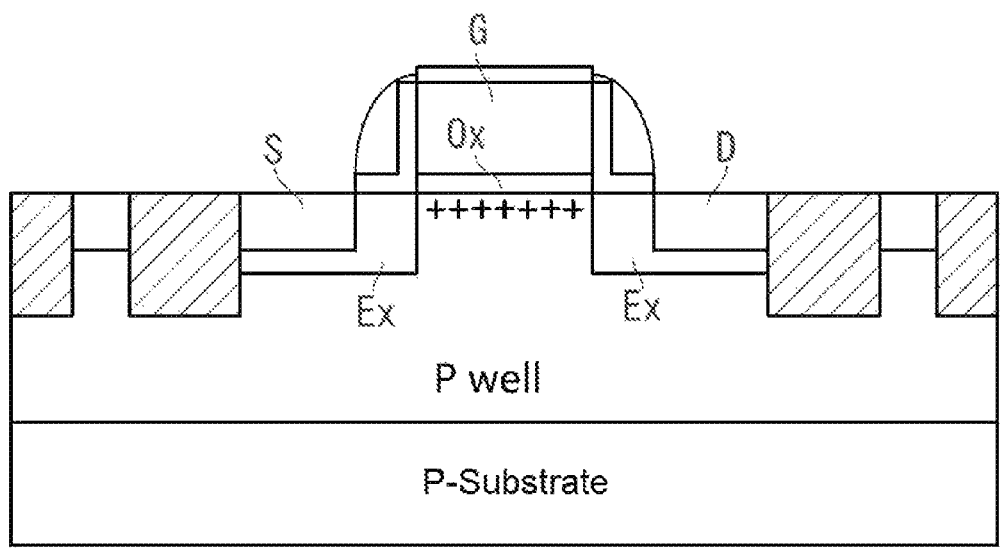
FIG. 6 is a cross-sectional view of an FET manufactured by the method for manufacturing the semiconductor element according to an embodiment of the present disclosure.
Figure 7:
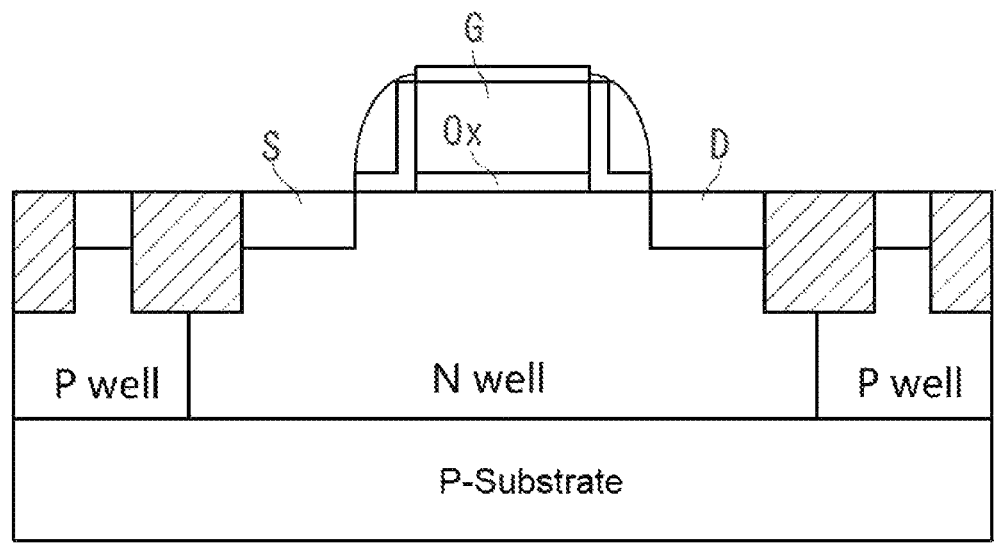
FIG. 7 is a cross-sectional view of a variable-capacitance diode manufactured by the method for manufacturing the semiconductor element according to an embodiment of the present disclosure.

When the FET and the variable-capacitance diode are formed through the above processes, structures shown in FIGS. 6 to 7 are formed. FIG. 6 shows a structure of the FET. FIG. 7 shows a structure of the variable-capacitance diode. As shown in FIG. 6, the FET formed through each of the above processes includes a P-well region, an N source region, an N drain region and a gate region. In addition, the FET further includes a channel region and an epitaxy region. Therefore, the FET has a proper threshold voltage. The FET is a high-performance FET, can work at a high speed, and can inhibit damage of the gate oxide film Ox caused by occurrence of hot carriers.

In another embodiment, as shown in FIG. 7, the variable-capacitance diode formed through the above processes includes an N-well region, an N source region, an N drain region and a gate region. In the variable-capacitance diode, the channel region and the epitaxy region are not formed. Therefore, as described later, the decrease of the capacitance value in the low-voltage region can be inhibited.

Figure 11:
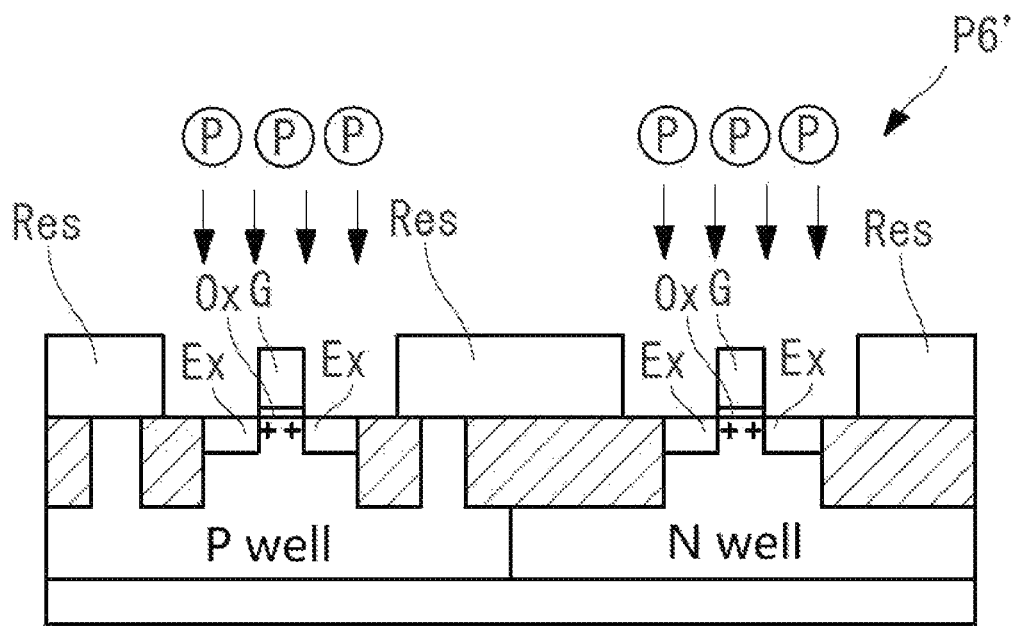
FIG. 11 shows a schematic diagram of an epitaxy forming process of the method for manufacturing the semiconductor element according to a reference example.
Figure 12:
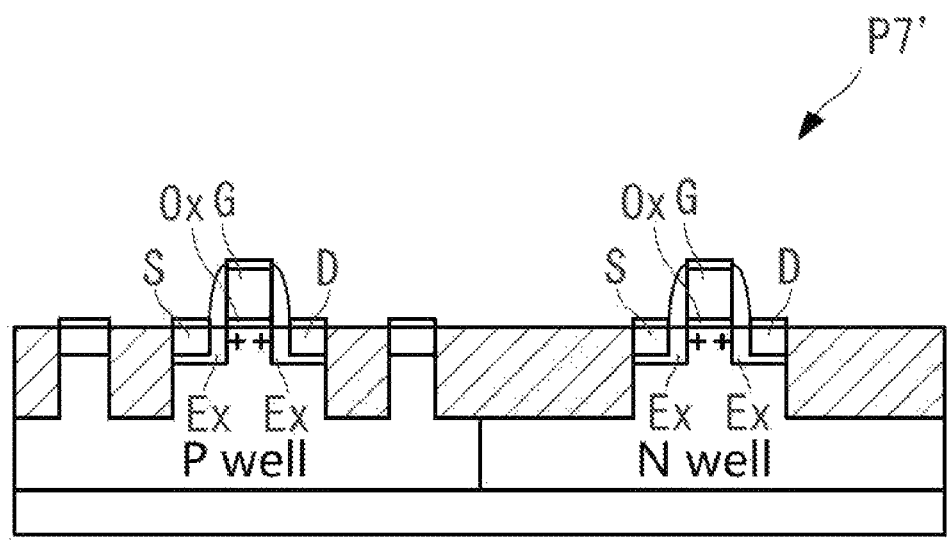
FIG. 12 shows a schematic diagram of a source/drain forming process of the method for manufacturing the semiconductor element according to a reference example.

Then, a method for manufacturing a semiconductor element according to a reference example is illustrated. The method for manufacturing the semiconductor according to the reference example has the following differences from that of the present disclosure: an epitaxy Ex is formed in a variable-capacitance diode region in an epitaxy forming process P6', so that the mask in a first masking process and a second masking process are universal. In the method for manufacturing the semiconductor according to the reference example, a well forming process P1' shown in FIG. 8, the first masking process, a channel forming process P3' shown in FIG. 9, a gate forming process P4' shown in FIG. 10, the second masking process, an epitaxy forming process P6' shown in FIG. 11, and a source/drain forming process P7' shown in FIG. 12 are performed as main processes.

Figure 8:
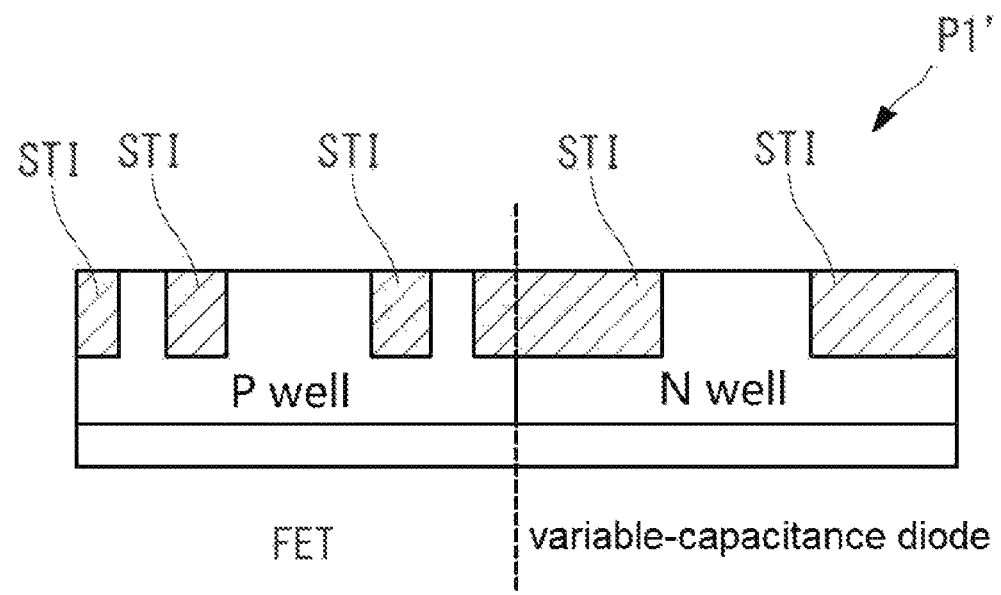
FIG. 8 shows a schematic diagram of a well forming process of a method for manufacturing the semiconductor element according to a reference example.

In the well forming process P1' according to the reference example, a well of the semiconductor element is formed on a surface of a substrate. As shown in FIG. 8, the well of an FET and the well of a variable-capacitance diode with the polarity opposite to the well of the FET are formed.

In the first masking process according to the reference example, a resist layer Res with a preset pattern is formed on a substrate surface by using masks. In the reference example, the mask in the first masking process and the mark in the second masking process are universal. Therefore, a P-well of the FET and an N-well of the variable-capacitance diode formed on the substrate are not covered by the resist layer Res.

Figure 9:
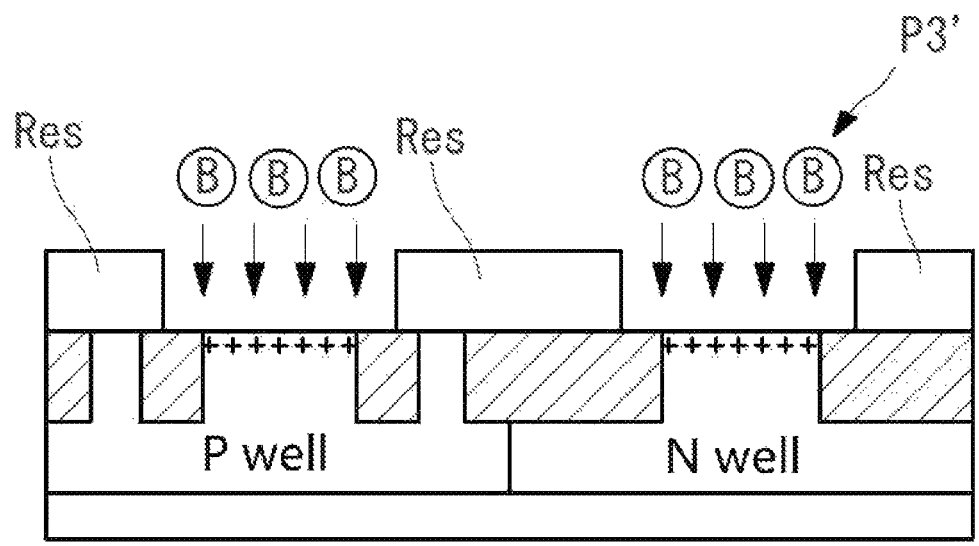
FIG. 9 shows a schematic diagram of a channel forming process of the method for manufacturing the semiconductor element according to a reference example.

In the channel forming process P3' of the reference example, in order to form channels in the FET region, impurities are implanted into the surface of the substrate. The impurity has a polarity same as the well of the FET formed on the surface of the substrate. As shown in FIG. 9, a P-well is formed in the FET region. In the channel forming process P3, the P type impurities (such as boron) are implanted into the surface of the substrate. At the moment, the resist layer Res is formed on the substrate surface through the first masking process. However, since the mask in the first masking process and the masks in the second masking process are shared, the P-well of the FET and the N-well of the variable-capacitance diode are not covered by the resist layer Res. Therefore, the P type impurities are implanted into the variable-capacitance diode region.

Figure 10:
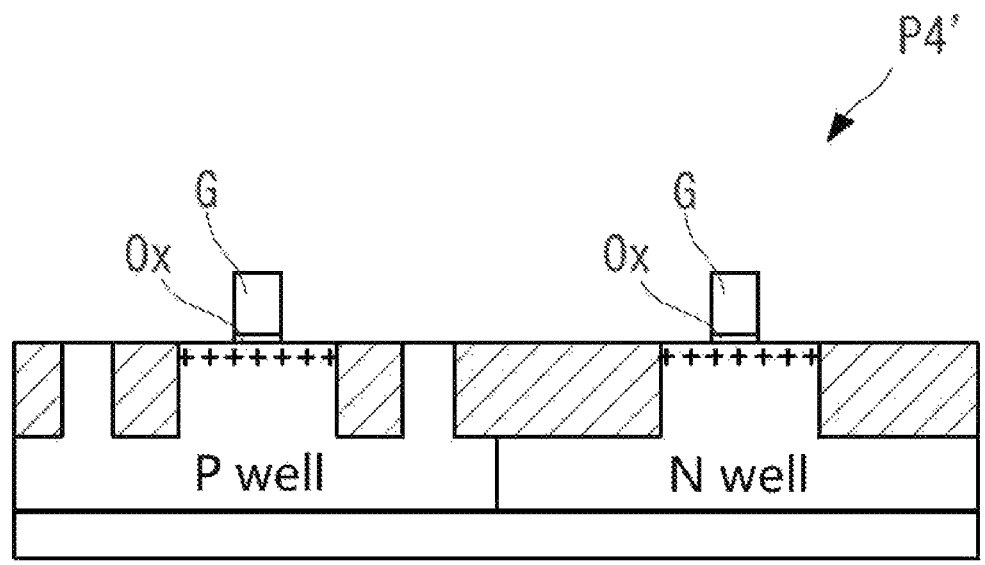
FIG. 10 shows a schematic diagram of a gate forming process of the method for manufacturing the semiconductor element according to a reference example.

In the gate forming process P4' according to the reference example, as shown in FIG. 10, gates G are respectively formed on the well of the FET region and the well of the variable-capacitance diode, the gates G are separated by insulating film.

In the second masking process according to the reference example, the resist layer Res with a preset pattern is formed on the substrate surface by using the masks. An epitaxy Ex is formed in the FET region, so that the performance such as high speed of the FET can be improved. In addition, an epitaxy Ex is formed in the variable-capacitance diode region, so that the capacitance characteristic of the variable-capacitance diode can be improved. Therefore, in the second masking process, the P-well of the FET and the N-well of the variable-capacitance diode formed on the substrate are not covered by the resist layer Res.

In the epitaxy forming process P6' according to the reference example, in order to form an epitaxy region for the well of the FET, impurities with the polarity opposite to the well of the FET are implanted into the surface of the substrate. As shown in FIG. 11, the P-well is formed in the FET region, so that in the epitaxy forming process P6', N type impurities (such as phosphorus) are implanted into the surface of the substrate. The N type impurities are also implanted into the variable-capacitance diode region, so that an epitaxy Ex is also formed in the variable-capacitance diode region.

In the source/drain forming process P7' according to the reference example, as shown in FIG. 12, a source S and a drain D are respectively formed in both the FET region and the variable-capacitance diode region.

Based on the above, in the manufacturing method according to the reference example, in order to form an epitaxy Ex in the variable-capacitance diode region, a resist layer Res not covering the variable-capacitance diode region is formed in a former process of the second masking process. Then, in order to reduce the total number of the masks, the masks used in the second masking process are also used in the first masking process. The resist layer Res generated in the first masking process does not cover the N-well of the variable-capacitance diode region. In the subsequent channel forming process P3', the P type impurities are also implanted into the variable-capacitance diode region.

Figure 13:
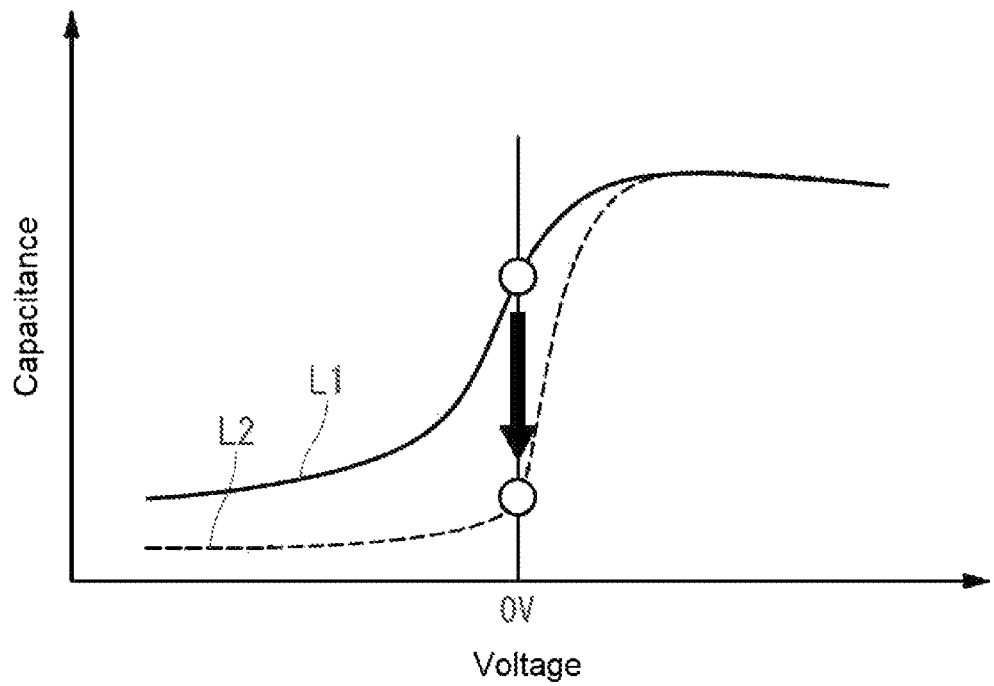
FIG. 13 is a deformation example of a C-V characteristic of a semiconductor element according to a reference example.

When the P type impurities are implanted into the N-well of the variable-capacitance diode region, the electrons in the N-wells countered with the holes in the P type impurities, and the state of majority carriers in the surface of the N-well of the variable-capacitance diode changes. The capacitance-voltage characteristic (C-V characteristic) of the variable-capacitance diode therefore changes. FIG. 13 shows a deformation example of the C-V characteristic under the condition that the P type impurities are implanted into the N-well of the variable-capacitance diode region. As shown in FIG. 13, compared with a condition (L1) that the P type impurities are not implanted into the N-well of the variable-capacitance diode region, a condition (L2) that the P type impurities are implanted into the N-well of the variable-capacitance diode region shows the capacitance characteristics near 0 V (near a low-voltage region) is deteriorated. That is, the capacitance value in the low-voltage region is not ensured. In addition, near 0 V, the voltage control performance of the capacitance is also reduced, the control over a larger voltage range cannot be guaranteed.

In other words, in the manufacturing method according to the reference example, although the total number of the masks can be reduced, impurities are implanted into the variable-capacitance diode region in the channel forming process P3', the C-V characteristic of the variable-capacitance diode is deteriorated.

Figure 14:
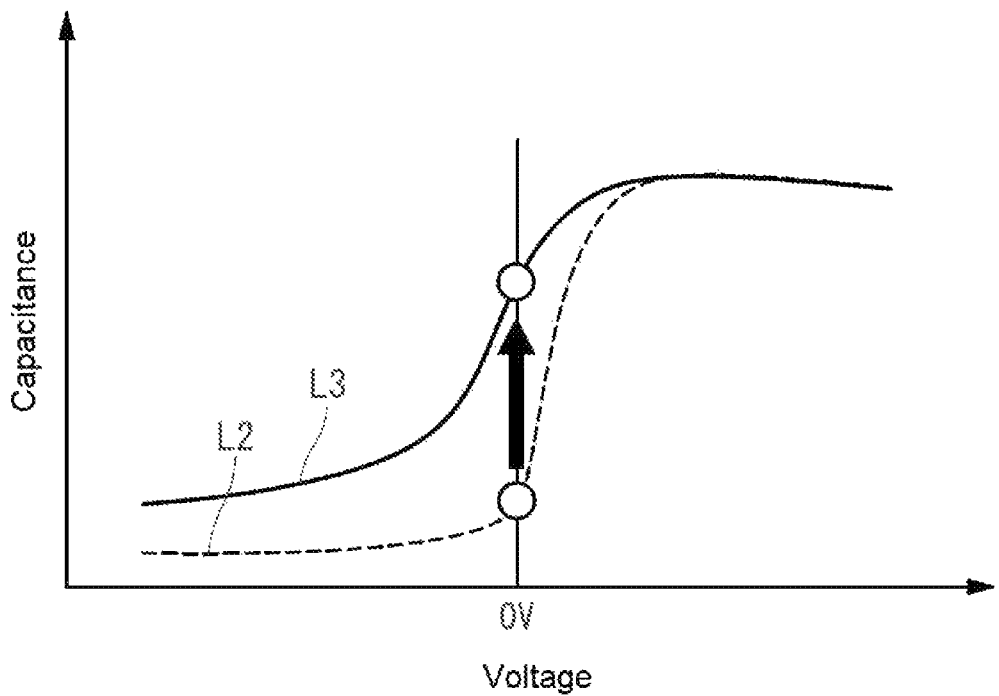
FIG. 14 is an example of a C-V characteristic of a semiconductor element according an embodiment of the present disclosure.

Correspondingly, in the method for manufacturing the semiconductor element according to the present embodiment, in the first masking process performed before the channel forming process P3, the resist layer Res covering the N-well of the variable-capacitance diode region is formed, so that the implantation of impurities into the variable-capacitance diode region in the channel forming process P3 can be prevented, and the deterioration of the C-V characteristic of the variable-capacitance diode is prevented. FIG. 14 shows the C-V characteristic of the variable-capacitance diode according to the present embodiment. As shown in FIG. 14, compared with the variable-capacitance diode (L2) according to the reference example, the variable-capacitance diode according to the present embodiment can ensure a high capacitance value (L3) in the low-voltage region. Therefore, the control performance of the variable-capacitance diode according to the present embodiment in the low-voltage region is high. Additionally, the first masks in the first masking process and the second masks in the second masking process can be shared, so that the total required number of the masks involved in the manufacturing of the semiconductor device can be reduced, and the cost therefore can be saved.

Although only the manufacturing of the N type FET and the variable-capacitance diode on the substrate is illustrated according to the present embodiment, the method is also applicable to a P type FET and the variable-capacitance diode. When forming the P type FET, the FET includes an N-well region, a P source region, a P drain region and a gate region. The FET further includes channel region and an epitaxy region. When forming the P type variable-capacitance diode, the P type variable-capacitance diode includes a P-well region, a P source region, a P drain region and a gate region. In the variable-capacitance diode, the channel region and the epitaxy region are not formed. The first masks in the first masking process and the second masks in the second masking process are shared.

In addition, at least two of the N type FET, the N type variable-capacitance diode, the P type FET and the P type variable-capacitance diode may be carried on the substrate. If the impurities are not implanted into the well of the variable-capacitance diode in the channel forming process P3, and the masks in the first masking process and the second masking process are shared, the manufactured semiconductor element can be properly selected.

As described above, according to the method for manufacturing the semiconductor element according to the present embodiment, before the channel forming process P3 of implanting the impurities with the polarity same as the well of the FET into the surface of the substrate, the first mask in the shape of covering the surface of the well of the variable-capacitance diode is used to perform masking. The implantation of the impurities with the opposite polarity into the well of the variable-capacitance device can be prevented, so that the deterioration of the C-V characteristic of the variable-capacitance device can be inhibited.

Furthermore, the masks used in the first masking process performed before the channel forming process P3 and in the second masking process performed before the epitaxy forming process P6 are in the same shape, so that, for example, the masks can be borrowed, the total number of the masks used in the manufacturing of the integrated circuit can be reduced, and the cost can be reduced.

The present disclosure is not limited to the foregoing embodiments, and various modifications may be made without departing from the gist of the present disclosure.

What is claimed is:

1. A method for manufacturing a semiconductor element, forming an FET of an MOS structure and a variable-capacitance element on a surface of a substrate, wherein the method comprises:
   a first masking process, forming a first implantation barrier layer on a surface of a substrate, wherein the first implantation barrier layer covers a surface of a well of a variable-capacitance element region, and does not cover a surface of a well of an FET region, wherein the well of the FET region comprises a plurality of shallow trench isolation (STI) regions;
   a channel forming process, implanting impurities into the surface of the substrate thereby forming a channel region for the well of the FET region, wherein the impurities forming the channel region have a polarity the same as the polarity of the well in the FET region formed on the surface of the substrate;
   a gate forming process, after the channel region for the well of the FET region is formed, forming gates respectively on the well of the FET region and the well of the variable-capacitance element region, wherein the gates are insulated from the well of the FET region and the well of the variable-capacitance element region by an insulating film;

a second masking process, generating a second implantation barrier layer on the surface of the substrate, wherein the second implantation barrier layer covers the surface of the well of the variable-capacitance element region, and does not cover the surface of the well of the FET region, wherein in the first masking process, the first implantation barrier layer is formed by using a photomask with a predetermined orientation relative to the substrate and a predetermined position relative to the substrate, and in the second masking process, the second implantation barrier layer is also formed by using the photomask with the predetermined orientation relative to the substrate and the predetermined position relative to the substrate; and an epitaxy forming process, after the gates are formed and the second masking process is performed, implanting impurities with the polarity opposite to the polarity of the well in the FET region into the surface of the substrate thereby forming an epitaxy region for the well of the FET region, wherein the epitaxy region is formed below the part of the surface of the substrate exposed by the gate of the FET region and between the plurality of STI regions, wherein the variable-capacitance element region comprises no channel region and no epitaxy region.

2. The method for manufacturing a semiconductor element as in claim 1, further comprising:

a well forming process, forming the well in the FET region, and the well in the variable-capacitance element region on the surface of the substrate, wherein the well in the variable-capacitance element region has a polarity opposite to the polarity of the well in the FET region, wherein the first masking process is performed after the well forming process.

3. The method for manufacturing a semiconductor element as in claim 1, wherein the first implantation barrier layer and the second implantation barrier layer are resist layers.

4. The method for manufacturing a semiconductor element as in claim 1, wherein when the channel forming process is completed, the first implantation barrier layer formed on a substrate surface is removed.

5. The method for manufacturing a semiconductor element as in claim 1, wherein when the epitaxy forming process is completed, the second implantation barrier layer formed on the substrate surface is removed.

6. The method for manufacturing a semiconductor element as in claim 1, wherein after the epitaxy forming process, sidewall is formed for the gates.

7. The method for manufacturing a semiconductor element as in claim 6, wherein when the sidewall is formed, a silicon oxide film is formed on the substrate surface, anisotropy is performed, and oxide films are remained on the sidewall of the gates.

8. The method for manufacturing a semiconductor element as in claim 1, further comprising:

before the gate forming process, forming a source and a drain in the FET region and the variable-capacitance diode region.

* * * * *